(12) United States Patent
Rudigier-Voigt et al.

(10) Patent No.: US 9,340,450 B2
(45) Date of Patent: May 17, 2016

(54) ETCHING METHOD FOR SURFACE STRUCTURING

(75) Inventors: Eveline Rudigier-Voigt, Mainz (DE); Matthias Bockmeyer, Mainz (DE)

(73) Assignee: SCHOTT AG, Mainz (DE)

( * ) Notice: Subject to any disclaimer, the term of this patent is extended or adjusted under 35 U.S.C. 154(b) by 1122 days.

(21) Appl. No.: 13/299,544

(22) Filed: Nov. 18, 2011

(65) Prior Publication Data
US 2012/0128938 A1 May 24, 2012

(30) Foreign Application Priority Data

Nov. 18, 2010 (DE) .......................... 10 2010 044 133

(51) Int. Cl.
| | |
|---|---|
| C03C 15/00 | (2006.01) |
| H01L 21/308 | (2006.01) |
| H01L 21/768 | (2006.01) |
| G03F 7/004 | (2006.01) |
| C03C 19/00 | (2006.01) |
| B44C 1/22 | (2006.01) |

(52) U.S. Cl.
CPC ................ *C03C 15/00* (2013.01); *B44C 1/227* (2013.01); *C03C 19/00* (2013.01); *G03F 7/004* (2013.01); *H01L 21/3086* (2013.01); *H01L 21/76817* (2013.01); *C03C 2218/33* (2013.01); *C03C 2218/34* (2013.01); *Y10T 428/24479* (2015.01)

(58) Field of Classification Search
CPC ....... G03F 7/004; G03F 7/00; H01L 21/3086; H01L 21/76817; B81C 1/00388; B81B 2203/033
See application file for complete search history.

(56) References Cited

U.S. PATENT DOCUMENTS

| | | | |
|---|---|---|---|
| 8,795,775 B2* | 8/2014 | Koo et al. ..................... 427/264 |
| 2008/0041815 A1 | 2/2008 | Li et al. |
| 2009/0075199 A1* | 3/2009 | Lungu ......................... 430/281.1 |
| 2010/0279228 A1* | 11/2010 | Davis et al. ................. 430/286.1 |

FOREIGN PATENT DOCUMENTS

| | | |
|---|---|---|
| DE | 3122544 | 12/1982 |
| JP | 6331844 | 12/1994 |
| JP | 2001188096 | 7/2001 |

\* cited by examiner

*Primary Examiner* — Duy Deo
(74) *Attorney, Agent, or Firm* — Ohlandt, Greeley, Ruggiero & Perle, LLP (57) ABSTRACT

An etching method for selective introduction of structures into surfaces of different substrates, such as glass or glass ceramic substrates, is provided. The method provides for surface structuring using an etch mask. The etchmask allows for the production of very fine structures on the substrate surfaces using liquid etching media. In this method the etch mask is produced on the substrate.

18 Claims, 3 Drawing Sheets

ETCHING METHOD FOR SURFACE STRUCTURING

CROSS REFERENCE TO RELATED APPLICATIONS

This application claims benefit under 35 U.S.C. §119(a) of German Patent Application No. 10 2010 044 133.3, filed Nov. 18, 2010, the entire contents of which are incorporated herein by reference.

BACKGROUND OF THE INVENTION

1. Field of the Invention

This invention relates to an etching method for selective introduction of structures into surfaces of different substrates. A preferred embodiment refers to surface structuring of glass or glass ceramic substrates.

2. Description of Related Art

Virtually, the invention may be used everywhere, where micro and nanostructures are desired on substrate surfaces, such as in microelectronic, or where these structures are desired due to their special macroscopic appearance, such as for example for decoration purposes.

Surface structuring can be employed on a large variety of substrates in numerous fields. In particular in the field of optical use it is necessary that the surface structuring meets high demands.

Often it is the object to directly realize structures, for example in glasses or glass ceramics. Thereby, the uses are versatile and vary from the modification of glass substrates for the purpose of visual cover and the use in the field of decoration to the structuring of glass covers in photovoltaic modules or of the lower sides of glass ceramic cooktops. Currently, such products are already available on the market.

Structured substrates are produced in a large variety of ways, such as for example by rolling of the glass which is still hot or of the glass ceramic or by so-called hot pressing. In this regard, it has to be considered that micrometer and nanometer structures can only be produced in a laborious and costly way so far, partially due to the numerous changes of tools to guarantee the reproduction accuracy. Disadvantages of the methods presented here are that the structures which are produced in this way have a tendency to rounding off and that smaller structures of <50 micrometers ($\mu$m) cannot be realized or only at great expense.

Also laser methods can be used for selective removal of surface materials, but these methods result in rounding off as well, in particular in the case of sharp or steep patterns. A new development in this field also allows the production of fine structures via high energy quick-pulses. But these methods have not reached productivity and are very expensive.

With a masking of the substrate surface it is also possible to produce structures in glasses or glass ceramics via sandblasting, but the roughness of the surface depends on the graininess of the sandblasting material, i.e. the factor which determines the dimensions is the roughness. Thus, very fine regular structures cannot be produced. Masking technologies for the introduction of structures into glass and/or glass ceramics are prior art, but the dimensions of the structures to be introduced depend on the used dot mask, respectively small structures in the range of <50 $\mu$m can only be produced with great effort which is not suitable for large-scale industrial applications. In practice this results in the fact the combinations of large and small structures are not possible so far. Etching techniques which are used in mask-based microstructure technologies are wet chemical or gas phase-based etching. So for example in JP 2001188096 A, a method is described in which in this way a photosensitive glass is provided with an UV mask, subjected to UV radiation and etched subsequently.

Also etching of glass by means of HF is known, for example from DE 3122544 A, which describes a method using an etch cover for the glass substrate for X-ray photolithography.

In contrast, in JP 6331844 A wave guide structures are realized in quartz glass using gas phase etching processes, wherein the masking technology is used as well. In this field excellent results have been achieved in the field of micro structuring in the last years. But these methods are still very expensive.

Currently, methods which are merely based on wet chemical etching are already used in large-scale industrial applications, either for the conditioning of surfaces, such as for example in the case of etch polishing or leaching of surface layers, or for the selective thinning of glass substrates.

The realization of very small structures with a size of <1 $\mu$m in glass or glass ceramic substrates is a challenge until now and cannot or only partially be achieved with the above-mentioned methods.

SUMMARY

Thus it is the object of the present invention to provide a method which can be conducted in a cost-effective way and allows the selective introduction of very fine structures into glass and/or glass ceramic substrate surfaces.

Particularly, the object is solved by a method for the introduction of a structure into a substrate surface, wherein a masking base material is applied onto the surface, a pattern selected according to the desired structure is embossed into the masking base material with the help of a punch, the masking base material is cured in at least one curing step, so that an etch mask is obtained, and a liquid etching medium is contacted with the etch mask for obtaining the desired structure in the surface of the substrate, characterized in that the etch mask does not have any holes in the area of the surface to be structured.

The method steps can be conducted in any order which is reasonable for the skilled person.

That the etch mask does not have any holes in the area of the surface to be structured means that the mask covers the whole surface to be structured and that it in particular has no macroscopic holes; with other words: the etch mask does not have any visible open areas. In particular it does not have any open areas which are large enough that the liquid etching medium after its application immediately comes in contact with the surface. Accordingly, the etch mask may definitely have pores; but these pores are not consistently formed through the mask and/or are so small that a direct contact of the etching medium with the substrate surface will not take place. Instead, the etching medium has to diffuse through the mask (diffusion etch mask) or has to remove sufficient material to reach the substrate (material removal mask). This is an essential aspect of the invention which makes it possible to obtain a selective structuring of the surface also in the case of an anisotropic etching process. The etch masks according to prior art always have holes through which the etching medium immediately comes in contact with the substrate, thus, the substrate is etched in an irregular manner and with the respective disadvantages. So, the etching process which takes place according to the present invention is preferably an anisotropic etching process, wherein the etch masks according to the present invention of course can also be used in the case of isotropic etching.

The punch embosses the desired pattern by direct physical contact with the masking base material.

Preferably, the application of the masking base material onto the surface is conducted all-over.

The fact that the etching medium is liquid has advantages. Liquid phase structuring is much cheaper than gas-based etching methods or methods using lasers; since the structure is defined by the punch, here a great flexibility is possible (structures of 10 nm-500 µm).

According to the present invention a structure means any selective arrangement of modifications of the surface properties of the substrate which can be obtained with an etching medium according to this invention. In particular, a "structure" means a pattern of indentations which can be produced in the surface of the substrate using the etching medium. The substrate is the element which is provided with a surface structure according to the present invention.

By a suitable choice of the masking base material the properties of the etch masks can be adjusted. The masking base material comprises at least one material which can be used for structuring and preferably comprises nanoparticles having inorganic and/or organic nature.

The masking base material preferably comprises UV curable additives which allow curing of the masking base material by UV radiation. This has the advantage that the masking base material can be cured during the step of embossing. Further, the masking base material can be provided such that thixotropic embossing is possible.

Preferably, the masking base material further comprises a sol-gel precursor. This sol-gel precursor preferable comprises a hybrid polymeric material.

The masking base material preferably comprises a basis material which can interlink to form a network as well as further preferably nanoparticles. The masking base material preferably comprises 40 to 100% by weight of basis material, further preferably 50 to 100% by weight, particularly preferably 60 to 90% by weight. Preferably, the masking base material contains 0 to 60% by weight of nanoparticles, further preferably 0 to 50% by weight and particularly preferably 10 to 40% by weight. In particularly preferable embodiments the masking base material consists of basis material and nanoparticles in the above-described proportions by weight.

The basis material comprises network formers, i.e. molecules which can cross-link with each other to form a network. The network can be of linear or branched nature and can have oligomeric or polymeric structure; the network can be of organic or inorganic nature or can represent a mixed form; the molecules itself can be oligomers or polymers carrying organic and/or inorganic functional groups. Such network forming components can consist of molecular, oligomeric and/or polymeric precursors containing organically cross-linking groups, as well as of organometallic and/or oxidic molecular or polymeric components which preferably may undergo inorganic hydrolysis, cross-linking reactions and/or condensation reactions, as well as of polysiloxanes. Preferably, the basis material consists of one or more of the above-mentioned substances.

Preferably, the masking base material may contain organic and/or inorganic fillers. Furthermore, the masking base material may contain organic auxiliary agents, such as flow-control agents, cross-linking agents and curing agents.

The nanoparticles are of organic or inorganic nature; they can be in oxidic and/or non-oxidic form.

The choice of the nanoparticles may functionalize the masking base material in such a way that for example organic or oxidic inorganic nanoparticles increase the resistance of the etch masks against acidic media.

The masking base material is a—preferably liquid, in particularly molecular or colloid disperse—composition which is cured pursuant to the process according to the present invention through a reaction which is typical for sol-gel materials to form the etch mask. The curing may be conducted through a thermally induced or alternatively UV light induced cross-linking reaction.

In the sense of the present invention preferably the term hybrid polymeric material also means a substance, which organic components have been at least partially decomposed due to a thermal curing process.

In one embodiment the etch mask comprises a condensate of one or more hydrolysable and condensable silanes and/or metal alkoxides, preferably of Si, Ti, Zr, Al, Nb, Hf, B and/or Ge. Preferably, the corresponding condensable components in the basis material of the masking base material can be selected from the group consisting of acryl silanes, epoxy silanes, acryl alkoxy silanes, acryl epoxy silanes, epoxy alkoxy silanes, allyl silanes, vinyl silanes, fluoroalkyl silanes, amino silanes, alkoxy silanes, metal alcoholates, metal oxide acrylates, metal oxide methacrylates, metal oxide acetylacetonates or mixtures thereof.

Preferred network formers in the basis material are: methacryloxy propylsilane, glycidyl propylsilane, zirconium sec-butylate acrylate, titanium ethylate acrylate, titanium propylate acrylate, zirconium sec-butylate methacrylate, titanium ethylate methacrylate, titanium propylate methacrylate, tetraethoxysilane, tetramethoxysilane, methyltriethoxysilane, methyltrimethoxysilane, ethyltrimethoxysilane, propyltrimethoxysilane, mercaptopropyltrimethoxysilane, aminopropylsilane, vinyltriethoxysilane, allyltriethoxysilane, phenyltriethoxysilane, triethoxysilylpropyl succinic acid anhydride and/or fluorooctyl silane.

Preferably, the masking base material comprises basis material which has an inorganic degree of condensation of the hydrolysate in the etch mask of higher than or equal to 50%, preferably higher than 70%, after conducting the method according to the present invention.

The groups (as components of the basis material) which cross-link in the sol-gel process, thus via inorganic hydrolysis or condensation, can be the following functional groups: $TiR_3(X)$, $TiR_2(X)_2$, $ZrR_2(X)_2$, $ZrR_3(X)$, $SiR_3(X)$, $SiR_2(X)_2$, $TiR(X)_3$, $ZrR(X)_3$, $AlR_2(X)$, $AlR_1(X)_2$, $SiR(X)_3$ and/or $Si_2(X)_6$, $TiX_4$, $ZrX_4$, $SiX_4$, $AlX_3$, $TiR_3(OR)$, $TiR_2(OR)_2$, $ZrR_2(OR)_2$, $ZrR_3(OR)$, $SiR_3(OR)$, $SiR_2(OR)_2$, $TiR(OR)_3$, $ZrR(OR)_3$, $AlR_2(OR)$, $AlR_1(OR)_2$, $Ti(OR)_4$, $Zr(OR)_4$, $Al(OR)_3$, $Si(OR)_4$, $SiR(OR)_3$ and/or $Si_2(OR)_6$, wherein preferably OR=alkoxy such as preferably methoxy, ethoxy, n-propoxy, ipropoxy, butoxy, isopropoxyethoxy, methoxypropoxy, phenoxy, acetoxy, propionyloxy, ethanolamine, diethanolamine, triethanolamine, methacryloxypropyloxy, glycidylpropyloxy, acrylate, methylacrylate, acetylacetone, ethyl acetate acetic ester, ethoxy acetate, methoxy acetate, methoxyethoxy acetate or methoxyethoxyethoxy acetate or mixtures thereof. In particular embodiments, R is preferably a methyl, ethyl, n-propyl, butyl, allyl, vinyl, aminopropyl and/or fluorooctyl group. Preferably, X is Cl, Br, F or a mixture thereof.

Preferably, the masking base material is applied at temperatures of 5 to 45 degrees Celsius (° C.), in particular 15 to 30° C. In preferable embodiments the masking base material is applied at room temperature.

Preferably, the nanoparticles are particles having a particle size in the nanometer to micrometer range which are suitable for controlling the resistance of the etch mask against the used etching medium as well as the permeability thereof for the etching medium. Preferably, these particles have sizes of 0.5 nm to 10 µm, further preferably 2 nanometers (nm) to 150 nm, in particularly preferably 4-40 nm.

According to this invention particle sizes in the range of <4 nm are determined by means of small angle X-ray analysis, particle sizes between 4 nm and 20 µm by means of dynamic light scattering and particles of >20 µm by means of scanning electron microscopy. The particle size is defined as a mean value of the size of at least 20 particles.

Preferably, the nanoparticles essentially consist of carbides, nitrides, oxides, fluorides, oxynitrides and/or hydroxyfluorides. Particularly preferably, these anions are paired with cations of titanium, silicon, aluminium, calcium, yttrium, zirconium, magnesium, zinc, lanthanum, cerium, gadolinium, tin, boron, sodium, potassium and/or lithium. In particular they are titanium nitride (TiN), titanium oxynitride (TiON), silicon nitride ($SiN_x$), silicon carbide (SiC), aluminium nitride (AlN), titanium carbide (TiC), silicon oxynitride ($SiO_xN_y$), titanium aluminium nitride (TiAlN), silicon dioxide ($SiO_2$), magnesium fluoride ($MgF_2$), magnesium hydroxyfluoride (MgOHF), calcium hydroxyfluoride (CaOHF), titanium dioxide ($TiO_2$), boron oxide ($B_2O_3$), aluminium oxide ($Al_2O_3$), zirconium dioxide ($ZrO_2$), yttrium oxide ($Y_2O_3$) and/or calcium fluoride ($CaF_2$), cerium oxide ($CeO_2$) and/or yttrium stabilized zirconium oxide.

Preferably, the nanoparticles consist of silicon dioxide ($SiO_2$), magnesium fluoride ($MgF_2$), titanium dioxide ($TiO_2$), aluminium oxide ($Al_2O_3$), zirconium dioxide ($ZrO_2$), yttrium oxide ($Y_2O_3$), calcium fluoride ($CaF_2$) or mixtures thereof.

Preferably, the nanoparticles are bonded in a reactive manner with silanol groups and/or other hydroxyl groups of metal oxides and/or their organometallic and/or hybrid polymeric compounds, or via condensation reaction, respectively.

In a preferable embodiment according to the present invention these nanoparticles are embedded into the network of the layer in a reactive manner. This means, that a chemical reaction of the preferably oxidic nanoparticle surface and its hydroxyl groups has taken place with the functionalities of the basis material which are able to cross-link.

Preferably, these nanoparticles are produced by flame pyrolysis and/or precipitation reactions and/or synthesis under increased pressure from the gas phase or liquid phase.

Particularly preferably, the nanoparticles are used dispersed in non-aqueous, preferably alcoholic or non-polar solvents. For that, the nanoparticles are preferably stabilized by means of surface-active reagents. These may for example be: tetramethylammonium hydroxide, polyethylene, polylactic acid, polyamino acid, polycaprolactone, para toluene sulfonic acid, poly alkyl cyanoacrylate and/or polyethylene oxide-block-polyglutamic acid.

In a preferable further embodiment of the present invention the masking base material is mixed with a photoinitiator and curing by means of electromagnetic radiation, in particular by means of UV light, is conducted. As UV starters for acrylate- or methacrylate-based masking base materials preferably radical photoinitiators, such as for example 1-hydroxycyclohexyl phenyl ketone and/or benzophenone, are used. For glycidyl-based sol-gel precursors preferably cationic photoinitiators, such as for example of the group of iodonium salts, sulfonium salts and/or non-ionic photoinitiators, such as for example diphenyliodonium nitrate, diphenyliodonium triflate, diphenyliodonium p-toluene sulfonate, N-hydroxynaphthalimide triflate, N-hydroxyphthalimide triflate, thiobis(triphenyl sulfonium hexafluorophosphate) and/or iodonium-(4-methylphenyl)[4-(2-methylpropyl)phenyl]hexa-fluorophosphate(1-), are used.

So, the masking base material can be stabilized in a very simple way and can be thermally cured in subsequent steps as provided for a preferred embodiment according to the present invention.

In a preferred embodiment according to the present invention components of the basis material of the mask may be polysiloxanes. For example they may be methyl and/or phenyl polysiloxanes which for example are terminated by hydroxyl, glycidyl and/or polyether.

A feature of a particular embodiment is that organic additives, such as for example dipentaerythritol pentaacrylate, hexanediol diarylate, trimethylolpropane triacrylate and/or succinic acid anhydride, are added to the masking base material as curing agents.

For the production of masking base materials according to the present invention a thickener, such as for example polydisperse silicic acid, cellulose and/or xanthan may be used in the sol-gel precursor.

In a particular embodiment according to the present invention flow-control agents which for example may be selected from the class of substances of polyether modified dimethylsiloxanes are added to the sol-gel material.

Preferably, the masking base material is applied onto the surface by means of screen printing, pad printing, dip coating, roller coating, flooding, spraying, etc.

Preferably, the punch is manufactured from a polymer material, such as silicone, as well as it is translucent in a range of wave lengths of 200-400 nm, i.e. in the UV range. In particular embodiments, however, the punch may also consist of other materials which are not transparent for UV light, such as for example metal foils or other materials. Then the UV curing step is omitted and the embossing process is characterized in that it is thixotropic or that the structure is thermally cured. In the latter case, either a temperature stable silicone is used as a punch material or the punch material is selected such that it burns in the thermal process, thus, cannot be used again.

Preferably, the punch is manufactured starting from a master piece. The master piece already comprises the structure information which can be found in the surface of the finally structured substrate. In this case, the structure is preferably a regular, in particular periodic structure in a preferable scale of 100 nm to 100 µm having an aspect ratio of 0.1 to 4, particularly preferably of 0.5 to 2. Preferably, the structures have a pattern of repetitive structure elements.

In particular embodiments the structures may also be twisted to each other by 30 to 70°, particularly preferably by 50 to 65°, such as for example in the case of a combs structure.

Preferred structure elements are pyramids, inverted pyramids, cross lattices, moth eyes, honeycomb structures or also other structures. But also other structures are possible.

In a particular embodiment however, the structure may also be non-periodically repetitive or stochastic.

Preferably, the master piece is shaped from a commercially available, liquid or rigid polymer, and thus a punch is produced. The shaping may be conducted under vacuum or alternatively under ambient conditions. In addition, the production of the punch may be conducted at increased temperature in the range of from 40-100° C., preferably 50-90° C., particularly preferably 60-80° C. It was shown that for small structures in the range of <400 nm an increased temperature during the production of the punch is advantageous, because in this way few to no shaping defects can be found in the punch. The punch may be applied in the embossing step in a continuous manner, i.e. preferable in an unrolling movement, or statically, i.e. two-dimensionally, to achieve the best embossing result and to minimize air entrapments.

In a particular embodiment the punch consists of a material having a surface energy which is different to that of the layer to be embossed to minimize therewith the adhesion between the punch and the layer to be embossed.

In a further embodiment the punch may also be provided with a layer having a surface energy which is different to that of the layer to be embossed. Such materials or coatings preferably contain fluorosilanes, but they may also be of other materials which are known by the skilled person.

Optionally, the punch is also previously provided with a sol-gel layer to further increase the accuracy of the embossed figure. This may for example be conducted by flooding, printing or similar methods.

Optionally, the step of embossing is conducted in vacuum to prevent air entrapments in the etch mask. After the removal of the punch an etch mask is preferably in the form of a structured thin layer having a mean layer thickness in the range of from 0.05 to 10 µm. In particular embodiments the etch mask has a thickness of only about 1 nm at certain sites. These sites are normally sites with a short diffusion path and at these sites the etching medium at first reaches the substrate.

Depending on the composition of the masking base material different types of etch masks can be obtained. By the action of the punch indentations have been introduced into the layer of the masking base material which had been applied onto the surface, wherein at the sites of the indentations the etch mask has a smaller thickness than in the residual areas. The etch mask obtained therefrom may be a material removal mask or a diffusion mask depending on the kind and amount of the nanoparticles and depending on the kind and amount of the basis material.

In the case of a material removal mask (FIG. 3) a uniform removal of material is conducted during the etching step, so that the mask becomes thinner. In the area of the indentations no etch mask is present any longer after a special period of time, whereas the etch mask further protects the substrate from the attack of the etching medium in the residual areas. Thus, only in the area of the indentations a removal of material from the substrate will be achieved. Such material removal masks are preferable to be used with isotropic etching media, wherein it has to be guaranteed that the mask material is etched slower or with the same rate than the substrate, i.e. the etching rate of the substrate to be etched is higher than or equal to that of the mask material. In this case, structures correspond to the punch or have a stereo exaggeration. In a particular embodiment the mask material can be designed such that the etching rate is higher than that of the substrate to be etched, so that partially strongly flattened homogenous structures can be realized.

Basically, the etching process can be conducted on both sides of the element to be etched or only on one side thereof. In a particular embodiment the other side of the substrate which should not be provided with a structure is protected by a protection layer, wherein such protection layers may consist of dense $SiO_2$. According to one embodiment of this invention the etch mask which is prepared in said method is a material removal mask which preferably consists of an organic polymer network and preferably is dense, i.e. has no micro cracks. Preferably, the etch mask comprises pores in an extent of <20% by volume, particularly preferably <10% by volume, as determined by ellipsometric porosimetry according to Baklanov.

In the case of a diffusion etch mask (FIG. 4) also indentations are obtained in the etch mask under the influence of the punch. However, here the etch mask is not attacked by the etching medium; the etching medium diffuses through the etch mask to the surface of the substrate. To ensure that such etch mask is target-aimed, the diffusion rate of the etching medium through the mask has to be smaller than the etching rate of the substrate. Otherwise, irregular structures would be obtained in the surface. According to an embodiment of this invention the etch mask produced in said method is a diffusion etch mask which preferably consists of only inorganic components and has pores and/or meso pores of >20% by volume, preferably >50% by volume.

The etching medium serves for the introduction of the structure into the surface of the substrate during the etching step. Preferably, the etching medium is liquid at room temperature, in particular an aqueous solution. Depending on the design of the substrate and the method an alkaline or acidic etching medium is selected.

Preferable alkaline etching media have a $pK_B$ value of smaller than 3.25 and contain sodium hydroxide, potassium hydroxide, tetramethylammonium hydroxide (TMAH) and/or ethylenediamine pyrocatechol (EDP) as bases. In this case, the concentration of the base in the etching medium is preferably 5% to 100% (percentage by mass), further preferably 10% to 50% (percentage by mass).

Preferable acidic etching media have a $pK_S$ value of smaller than 3.25 and contain in a preferable embodiment hydrofluoric acid (HF), sulfuric acid ($H_2SO_4$), nitric acid ($HNO_3$), hydrochloric acid (HCl), phosphoric acid ($H_3PO_4$) and/or ammonium fluoride ($NH_4F$) as acids.

In this case, the concentration of the acids in the etching medium is preferably 30% by weight to 100% by weight.

The acidic etching media may preferably comprise additives of organic acids. Preferably, these are formic acid (HCOOH) and/or acetic acid ($H_3CCOOH$). The organic acids are preferably used in concentrations of 10 to 40%.

In a further embodiment also buffered solutions may be used.

The etching medium is contacted with the etch mask in an etching bath (etching step). Preferably, the etching bath has a temperature of 20 to 100° C., further preferably 50 to 90° C. In this case, the etching medium is in contact with the etch mask, preferably for a period of time of 0.1 to 10 minutes, further preferably 1 to 5 minutes.

In a further embodiment the etching bath is additionally sonicated with ultrasound during the etching process.

Preferably, the method according to the present invention comprises a step of purification after the step of etching. In this case, the substrate is washed with a purification medium. Preferably, the purification medium is an aqueous solution, in particular of hydrofluoric acid. Preferably, the step of purification takes approximately 10 seconds to 10 minutes.

In at least one curing step the masking base material is cured after being applied onto the surface. During the curing process the sol-gel transformation takes place. In this case, the sol-gel precursors cross-link, wherein polymeric compounds are produced so that a resistant etch mask is obtained. This step of curing may be conducted before, during or after the step of embossing with the punch. But preferably, the step of curing is conducted during the step of embossing. During the step of curing the masking base material is thermally or photochemically cured, wherein photochemical curing is preferred. In the case of photochemical curing preferably a punch is used which is translucent for the wave length which is used to initiate the curing process. Preferably, light in the UV wave length range is used for the curing process. In cases, where photochemical curing is used, the masking base material preferably comprises a photoinitiator. In preferred embodiments the masking base material contains UV or thermally cross-linking organic monomers selected from the classes of acrylates, methacrylates and/or expoides as basis material. The proportion by mass of the polymers which are capable to organic cross-linking and/or of the hybrid polymer monomers is 10 to 100%, preferably 40 to 90%, in particularly preferably 50 to 70%, based on the starting monomers of the basis material. Preferred is a combination of steps of curing, such as for example at first a photochemical step of curing and after the removal of the punch a subsequent thermal step of curing.

In cases in which no photochemical curing is conducted, the punch can be removed again either directly (so-called thixotropic embossing) after the step of embossing or after a thermal curing step with the punch, and the structure is transferred to the layer to be embossed.

According to the present invention the embossing punch is impressed preferably at room temperature and preferably normal pressure.

If etch masks for alkaline media should be obtained, then the masking base material preferably contains a high proportion of inorganic components, in particular a proportion of inorganic material of between 10 and 50% (percentage by mass). Preferably, materials of $ZrO_2$ and $TiO_2$ are used as nanoparticles. The proportion by mass of $SiO_2$ of the inorganic material is preferably 1 to 100%. In a preferable embodiment the masking base material contains 0 to 30% (percentage by mass) of organic components which are not organically cross-linkable such as for example methyl groups and phenyl groups.

Masking base materials for acidic etching media preferably comprise 50 to 100% (percentage by mass) of organic components. Therefore, these masking base materials are preferably cured in a photochemical or thermal manner at temperatures of up to 300° C., in particular at temperatures below 200° C. Preferably, these masking base materials contain acrylates, methacrylates, vinyl derivates and/or epoxides as organic materials. In this case, the etching barrier property of the etch masks, such as against hydrofluoric acid, can selectively be adjusted via the ratio of the organic components to the inorganic, in particular hybrid polymeric components.

In preferred embodiments a step of pre-curing of the masking base material on the surface is already conducted before the step of embossing. This step of pre-curing is conducted in a thermal or photochemical manner, wherein photochemical pre-curing is particularly preferable.

Depending on the embodiment, the punch is removed from the masked layer before or after the step of curing. In every case, the punch is removed before the step of etching.

The method according to the present invention preferably comprises a further step of post-curing of the etch mask. The step of post-curing is preferably conducted at temperatures of 100 to 800° C., further preferably 300 to 740° C., in particular after the removal of the punch from the masked layer.

This invention further relates to a substrate, in particular a glass or glass ceramic substrate which has been provided with a surface structure pursuant to a method according to this invention, as well as an etchmask which has been produced according to this method. Furthermore, the invention relates to the use of sol-gel precursors (basis material) for the production of an etch mask, in particular an etch mask as obtained in the method of the present invention.

Production of an etchmask, Example 1: Methacryloxypropyl triethoxysilane (MPTES), tetraethoxysilane (TEOS) and methyltriethoxysilane (MTEOS) (basis material) were provided in a vessel. In this embodiment example about 0.6 mol of MPTES, about 0.2 mol of TEOS and about 0.2 mol of MTEOS were used.

Subsequently, to this mixture under cooling and stirring slowly 2.6 mol of distilled water charged with 0.02 mol of para toluene sulfonic acid were given. After stirring for 5 minutes, 500 g of a dispersion of 20 percentages by mass of anatase-nanoparticles having a crystallite size of 10 to 15 nm in n-butanol were added.

This solution was combined with a solution of titanium propylate and methacrylic acid. In this case, 0.75 mol of MPTES, 0.2 mol of TEOS and 0.2 mol of MTEOS as well as a solution of 0.3 mol of titanium propylate and 0.3 mol of methacrylic acid were used.

After the completion of the hydrolysis which had been conducted for a period of time of about 24 hours the volatile solvent was removed at a rotary evaporator at 120 mbar and 40° C. Subsequently, the solution was diluted with ethylene glycol monoethyl ether to 20 percentages by mass with respect to the inorganic solid content, and a photoinitiator was added to the composition. As a photoinitiator 2% (percentage by mass), based on the viscous hybrid polymer without solvent, of the photoinitiator 1-hydroxycyclohexyl phenyl ketone, available under the trade name Irgacure 184®, were added.

After the production of a layer on a glass substrate with the help of the screen printing method using a 180 mesh and the evaporation of the solvent, a polymeric, silicone-like embossing punch was impressed into the plastic gel film having low viscosity. The embossing punch consists of a material which is translucent in a wave length area of >230 nm, namely silicone, so-called sil-gels or rubber. A sinusoidal cross lattice having a period of 3 µm and a structure depth of 4 µm was used as structure of the embossing punch. While the embossing punch was in contact with the layer material a first step of curing of the layer was conducted by means of a UV lamp which emits in the wave length range of about 250 nm.

After the removal of the embossing punch a further step of UV-based curing of the layer and a step of thermal curing of the layer at 450° C. were conducted.

The mean layer thickness of the nanoparticle functionalized layer was between 1 and 4 µm. The layer material had a refractive index of about 1.9.

Production of an etch mask, example 2: Glycidylpropyl triethoxysilane (GPTES), tetraethoxysilane (TEOS) and methyltriethoxysilane (MTEOS) (basis material) were provided in a vessel. Here, about 0.6 mol of GPTES, 0.2 mol of TEOS and 0.2 mol of MTEOS were used. This solution was combined with a solution of aluminium sec-butylate and acetic acid ethyl ester, each 0.1 mol. Subsequently, to this solution under cooling and stirring slowly an acidic dispersion of an aqueous nanoparticulate $TiO_2$ dispersion charged with methanol and para toluene sulfonic acid was given. About 28 g of a $TiO_2$ dispersion with 18 percentages by mass of anatase and a crystallite size of 7 to 12 nm charged with about 60 g of methanol and 3.44 g of para toluene sulfonic acid were added. After stirring for 5 minutes 660 g of a dispersion of 20 percentages by mass of anatase-nanoparticles having a crystallite size of 10 to 15 nm in n-butanol were added.

After the completion of the hydrolysis which had been conducted for a period of time of about 24 hours the volatile solvent was removed at a rotary evaporator at 120 mbar and a bath temperature of 40° C. (ethanol). A photoinitiator was added to the obtained hybrid polymersol with reactively embedded finely dispersed nanoparticles. 2% (percentage by mass), based on the viscous hybrid polymer, of the cationic photoinitiator iodonium-(4-methylphenyl)[4-(2-methylpropyl)phenyl]hexafluorophosphate(1-) (Irgagure 250®) were added as photoinitiator. Subsequently, a coating on one side was applied by means of spin coating. A polymeric, silicone-like embossing punch was impressed into the plastic gel film having low viscosity a polymeric after the evaporation of the solvent. The embossing punch consists of a material which is translucent in a wave length range of >230 nm, namely silicone, so-called sil-gels or rubber. As the structure of the embossing punch a lattice structure consisting of a cross lattice having a period of 2 µm and a structure depth of 3 µm was provided. While the embossing punch was in contact with the masking base material a first step of curing of the layer was conducted by means of a UV lamp which emits in the wave length range of about 250 nm.

The alkaline etching step was conducted with 10 molar NaOH at a bath temperature of 65° C. The time of the etching step was 3 minutes. After the alkaline etching step residual components of the etch mask were removed by means of 1 molar HF.

The above-described and other features and advantages of the present disclosure will be appreciated and understood by those skilled in the art from the following detailed description, drawings, and appended claims.

BRIEF DESCRIPTION OF THE SEVERAL VIEWS OF THE DRAWINGS

The figures show exemplary, preferable embodiments of the present invention, but they do not limit the scope of the present invention.

DETAILED DESCRIPTION OF THE INVENTION

Figure 1:
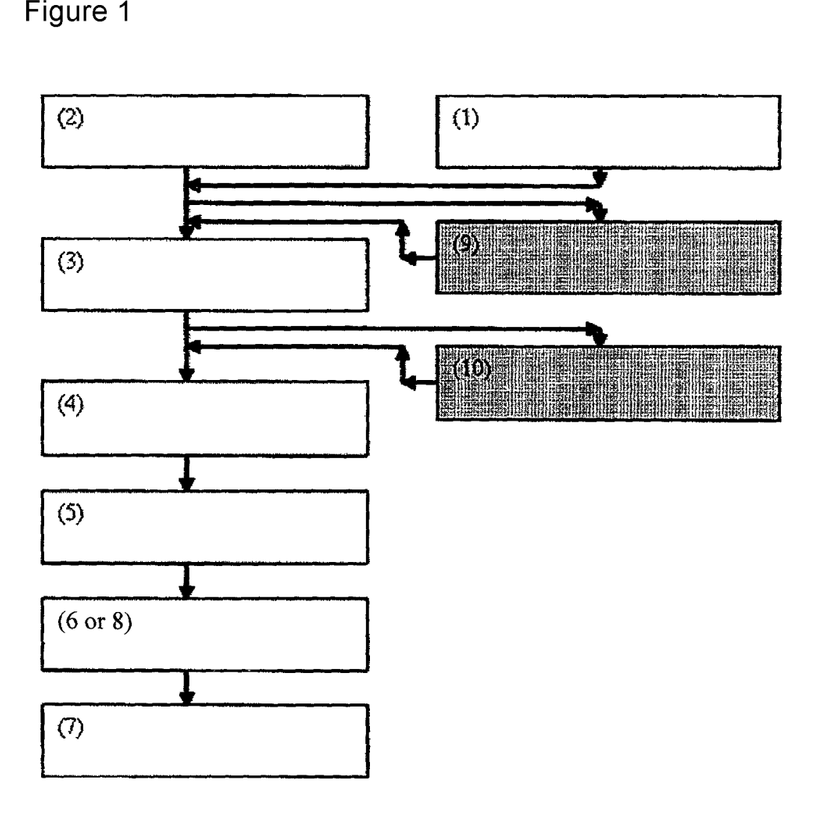
FIG. 1 is a flow chart schematically illustrating an exemplary embodiment of an etching method for surface structuring according to the present disclosure.

FIG. 1 shows a flow chart of the method according to the present invention, wherein an embossing punch is produced on the basis of a master piece structure (1) and a substrate is provided with a layer of the masking base material (2). Then, the masking base material is embossed with the embossing punch (3) by impressing the punch into the masking base material and at first leaving it there. Optionally, the masking base material is photochemically activated before the step of embossing (9). Also optionally, after the step of embossing (3) a photochemical or thermal step of pre-curing follows (10). Thereafter the embossing punch is removed from the layer of masking base material (4) and then the step of curing (5) is conducted. Then a wet chemical etching step follows which may be an acidic (8) or alkaline (6) embodiment. Subsequently, the surface of the substrate is purified (7).

Figure 2:
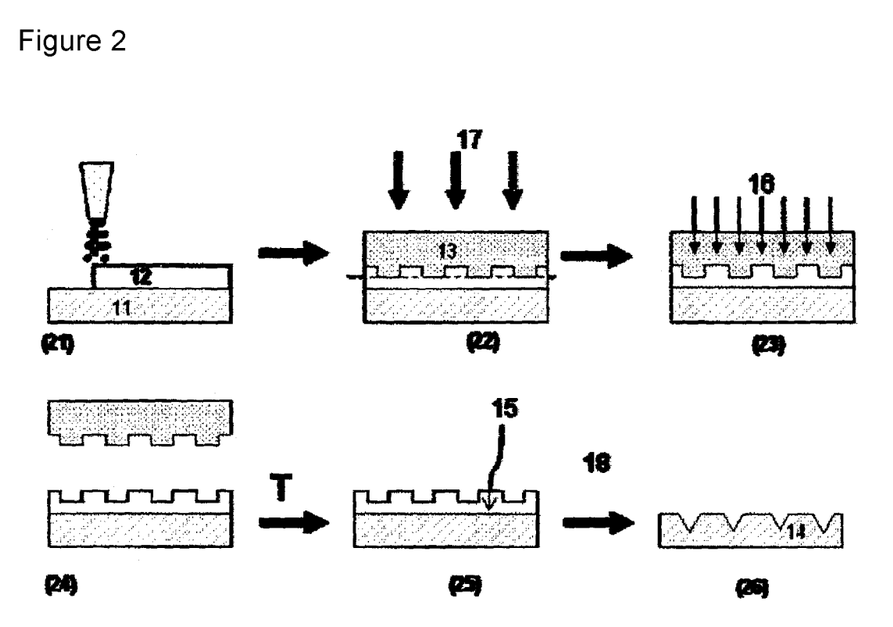
FIG. 2 is flow chart schematically illustrating an exemplary embodiment of an etching method for surface structuring according to the present disclosure.

FIG. 2 shows an exemplary sequence of the process, wherein at step (21) a masking base material (12) is applied onto a substrate (11), at step (22) under exposure of pressure (17) an embossing punch (13) embosses the masking base material, at step (23) which is then cured under the exposure of light or heat (16), at step (24) wherein subsequently the embossing punch is removed and a further step (25) of curing under the exposure of heat is conducted so that an etch mask (15) is obtained which under exposure of an etching medium (18) at mask removal step (26) provides the substrate with the structured surface.

Figure 3:
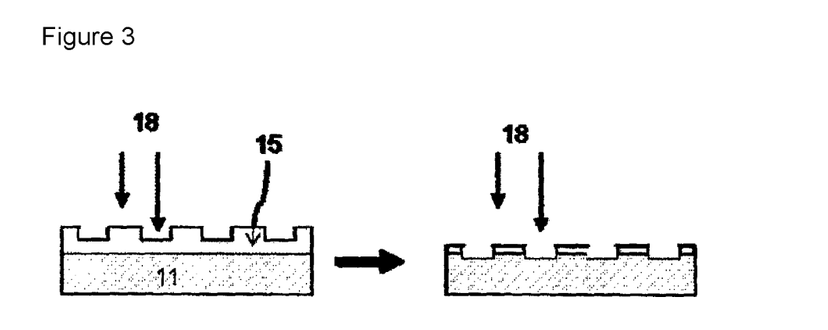
FIG. 3 is flow chart schematically illustrating an exemplary embodiment of a material removal mask step according to the present disclosure.

FIG. 3 shows the principle of a material removal mask step (26) according to the present invention. A substrate (11) with an etch mask (15) is shown. Under the exposure of an etching medium (18) the etch mask is removed. At the site where the thickness of the etch mask has the lowest value, the etching medium at first reaches the substrate and etches it selectively at this site.

Figure 4:
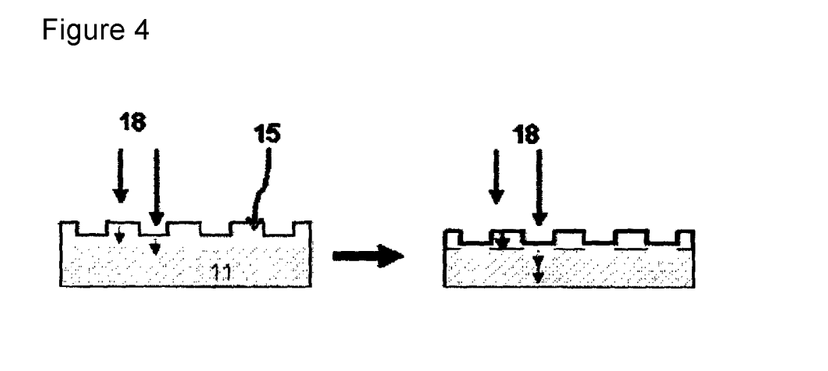
FIG. 4 is flow chart schematically illustrating an exemplary embodiment of a diffusion etch mask according to the present disclosure.

FIG. 4 shows the principle of a diffusion etch mask according to the present invention. A substrate (11) and an etch mask (15) are shown, wherein the etch mask is not removed under the exposure of the etching medium (18). The etch mask serves as a barrier for the etching medium insofar that it has to diffuse through the etch mask, before the substrate is reached. At the sites where the thickness of the etch mask has the lowest value, the etching medium at first reaches the substrate and etches it at these sites.

LIST OF REFERENCE SIGNS

1 Production of the embossing punch with master piece structure
2 Coating of the substrate with masking base material
3 Embossing of the masking base material by means of the embossing punch
4 Removal of the embossing punch from the layer
5 Curing
6 Wet chemical etching step, alkaline
7 Purification of the surface, acidic
8 Wet chemical etching step, alkaline
9 Photochemical activation of the masking base material
10 Photochemical or thermal pre-curing step
11 Substrate
12 Masking base material
13 Embossing punch
14 Substrate with structured surface
15 Etch mask
16 Exposure of light or heat
17 Exposure of pressure
18 Exposure of the etching medium
21 Application of the masking base material onto the surface
22 Embossing of a pattern into the masking base material
23 Curing of the masking base material
24 Removing of the embossing punch
25 Post-curing of the etch mask
26 Etching of the substrate

What is claimed is:

1. A method for the introduction of a desired structure into a surface of a substrate, comprising:
   applying a masking base material onto the surface;
   embossing a pattern selected according to the desired structure into the masking base material with a punch;
   curing the masking base material in at least one curing step to provide an etch mask; and
   contacting a liquid etching medium with the etch mask to etch the surface of the substrate to the desired structure, wherein the etch mask does not have any holes in the area of the surface to be structured so that the liquid etching medium, immediately after contacting the etch mask, does not come into contact with the surface of the substrate.

2. The method according to claim 1, wherein the masking base material comprises a basis material comprising one or more network formers.

3. The method according to claim 2, wherein the one or more network formers comprise a sol-gel precursor.

4. The method according to claim 2, wherein the one or more network formers comprise a network former selected from the group consisting of acryl silanes, epoxy silanes, acryl alkoxy silanes, acryl epoxy silanes, epoxy alkoxy silanes, allyl silanes, vinyl silanes, fluoroalkyl silanes, amino silanes, alkoxy silanes, metal alcoholates, metal oxide acrylates, metal oxide methacrylates and/or metal oxide acetylacetonates.

5. The method according to claim 1, wherein the masking base material comprises nanoparticles.

6. The method according to claim 5, wherein the masking base material comprises a basis material in a proportion of 40 to 100% by weight.

7. The method according to claim 5, wherein the masking base material comprises a basis material comprising one or more network formers.

8. The method according to claim 7, wherein the one or more network formers comprise a sol-gel precursor.

9. The method according to claim 7, wherein the one or more network formers comprise a network former selected from the group consisting of acryl silanes, epoxy silanes, acryl alkoxy silanes, acryl epoxy silanes, epoxy alkoxy silanes, allyl silanes, vinyl silanes, fluoroalkyl silanes, amino silanes, alkoxy silanes, metal alcoholates, metal oxide acrylates, metal oxide methacrylates and/or metal oxide acetylacetonates.

10. The method according to claim 5, wherein the nanoparticles have mean diameters of between 0.5 nm to 10 μm.

11. The method according to claim 5, wherein the nanoparticles have mean diameters of between 2 nm to 150 nm.

12. The method according to claim 5, wherein the nanoparticles are selected from the group consisting of carbides, nitrides, oxides, fluorides, oxynitrides, and hydroxyfluorides.

13. The method according to claim 5, wherein the masking base material comprises nanoparticles in a proportion of 0 to 60% by weight.

14. The method according to claim 1, wherein the etching medium is an aqueous solution.

15. The method according to claim 1, wherein the substrate is a glass or a glass ceramic.

16. A method for the introduction of a desired structure into a surface of a substrate, comprising:
  applying a masking base material comprising network formers onto the surface;
  curing the masking base material in at least one curing step to provide an etch mask that is sufficient to prevent a liquid substrate etching medium, immediately after application, to come in contact with the surface of the substrate; and
  using the liquid substrate etching medium to etch the desired structure into the surface of the substrate.

17. The method according to claim 16, wherein the network formers are sol-gel precursors.

18. A method for the introduction of a desired structure into a surface of a substrate, comprising:
  applying a masking base material onto the surface;
  embossing a pattern of indentations into the masking base material;
  curing the masking base material to provide an etch mask;
  contacting a liquid etching medium with the etch mask;
  allowing the liquid etching medium to, only in areas of the pattern of indentations, to diffuse through the etch mask or remove sufficient material from the etch mask so as to contact the surface of the substrate and to etch the substrate surface to form the desired structure in the surface at the areas.

* * * * *